(12) United States Patent
Williams et al.

(10) Patent No.: US 7,417,572 B1
(45) Date of Patent: Aug. 26, 2008

(54) VOLTAGE INTERPOLATION IN DIGITAL-TO-ANALOG SIGNAL CONVERSION

(75) Inventors: Stephen Williams, Baltimore, MD (US); Eric Naviasky, Ellicott City, MD (US); William Evans, Catonsville, MD (US)

(73) Assignee: Cadence Design Systems, San Jose, CA (US)

( * ) Notice: Subject to any disclaimer, the term of this patent is extended or adjusted under 35 U.S.C. 154(b) by 0 days.

(21) Appl. No.: 11/645,519

(22) Filed: Dec. 27, 2006

(51) Int. Cl.
*H03M 1/00* (2006.01)

(52) U.S. Cl. .................. 341/136; 341/144; 341/145; 341/153; 341/154

(58) Field of Classification Search ........... 341/136, 341/145
See application file for complete search history.

(56) References Cited

U.S. PATENT DOCUMENTS

| | | | | |
|---|---|---|---|---|
| 5,396,245 A | * | 3/1995 | Rempfer | 341/145 |
| 5,801,655 A | * | 9/1998 | Imamura | 341/145 |
| 5,859,606 A | * | 1/1999 | Schrader et al. | 341/144 |
| 6,326,913 B1 | * | 12/2001 | Chao et al. | 341/144 |
| 6,441,763 B1 | * | 8/2002 | Nakao | 341/154 |
| 6,707,404 B1 | * | 3/2004 | Yilmaz | 341/120 |
| 7,015,847 B1 | * | 3/2006 | McLachlan et al. | 341/145 |

* cited by examiner

*Primary Examiner*—Khai M Nguyen
(74) *Attorney, Agent, or Firm*—Rosenberg, Klein & Lee

(57) ABSTRACT

A multiple-input follower amplifier is coupled through a configuration of switching devices to an upper reference voltage at a number of its inputs and to a lower reference voltage at the remaining number of its inputs to form a voltage interpolator. The output of the voltage interpolator is a voltage between the upper and lower reference voltages proportional to the number of inputs coupled to each reference voltage. The voltage interpolator may be constructed so that the interpolated voltage may be selected through a reduced number of signal lines, such as by a row/column selection scheme. A voltage reference circuit providing the upper and lower reference voltages may also implement a row/column selection mechanism, thereby allowing a decoding scheme common to both a voltage reference circuit and a voltage interpolator in a digital-to-analog converter.

11 Claims, 8 Drawing Sheets

VOLTAGE INTERPOLATION IN DIGITAL-TO-ANALOG SIGNAL CONVERSION

BACKGROUND OF THE INVENTION

1. Field of the Invention

The invention described herein is related to generating a voltage amplitude signal in accordance with a digital code. More specifically, the invention is related to converting a digital code to an analog signal by interpolating between coarse reference voltage levels to produce an output voltage.

2. Description of the Prior Art

Modern electronic systems operate on signals bearing information to be relayed over a signal path, where the information is borne generally in either a varying voltage amplitude of an analog waveform or as a numeric value of a binary digital word. Signal conversion is thus necessary at different stages in the system to obtain an analog signal from its corresponding digital code representation, and vice-versa. Modern mixed-signal systems may therefore contain numerous digital-to-analog converters, or DACs. Although many DACs have high speed and precision requirements, many others require only modest linearity and speed, such as for calibration to minimize effects of process, temperature and voltage differences accentuated by modern deep sub-micron integrated circuit manufacturing processes. For these so-called utility DACs, it is beneficial to minimize power consumption and circuit area, especially since the same DAC design may be used in several different places in any given system.

One such utility DAC design is that of the voltage interpolating DAC, where coarse voltage references are generated through, for example, a tapped resistor string. The final output voltage is then fine-tuned between the coarse voltages by a voltage interpolator, which, as the name suggests, interpolates many voltage levels between two reference voltages with which it is provided.

Referring to FIG. 1, there is shown a schematic diagram of a prior art voltage interpolator, which was designed by CADENCE DESIGN SYSTEMS, INC. and has been incorporated into various DAC designs in recent years. The depicted voltage interpolator 100 is a multiple-input folded-cascode amplifier 110 combined with a Miller compensated output stage 150. Each differential pair implementing an input stage, a representative one of which is illustrated at 120, is coupled to one of the reference voltages $V_A$ or $V_B$ through a switching device 122. The reference voltages are supplied by a reference voltage generator, such as a tapped resistor string designed for such purpose. The interpolated output voltage $V_{OUT}$ is determined by the number of inputs connected to $V_A$ and the number of inputs connected to $V_B$. For example, if half of the N inputs are coupled to $V_A$ and half to $V_B$, $V_{OUT}$ would be a voltage halfway between $V_A$ and $V_B$.

Voltage interpolator 100, although suitable in its function, occupies a significant percentage of the physical area of an integrated circuit die in realizing the DAC. Each differential pair 120 requires a dedicated current source 125, which, in large numbers, consume a significant portion of precious circuit die area. Further, each differential pair 120 requires a switching device 122 to connect the input reference voltage thereto. Whereas the switching device 122 is shown as a single-pole double-throw switch, the implementation of such is generally through at least a pair transistors respectively conveying one of the reference voltages to the input of the differential stage 120. Each of those transistors in turn requires an associated control line, which must be routed with the other interconnections required to connect the numerous components of the DAC. Moreover, the control lines require associated circuitry to implement the switching device selection logic. Thus, it should be apparent to the skilled artisan that the die space necessary to implement the input stage 110 alone of voltage interpolator 100 is significant.

The output stage 150 of voltage interpolator 100 not only consumes die space, but significantly contributes to the overall power consumption requirements of the DAC. Additionally, the output stage 150 presents considerable complexity to stabilize the negative feedback design.

Given the shortcomings of the prior art, the need has been felt for a voltage interpolating DAC that is more compact and less complex, while guaranteeing monotonic interpolation steps.

SUMMARY OF THE INVENTION

In a first aspect of the invention, an electrical circuit is provide that includes a plurality of current control devices commonly interconnected at first terminals thereof and commonly interconnected at second terminals thereof. Each of the current control devices has an amount of electrical current flowing through it that is proportional to a voltage applied to respective control terminals thereof. A plurality of switching devices is provided to selectably couple the respective control terminal of each of the current control devices to one of an upper reference voltage and a lower reference voltage. An output node is coupled to the commonly interconnected second terminals and to a constant current source to provide a voltage between the upper and lower reference voltages proportional to a number of the current control devices coupled to each reference voltage.

In another aspect of the invention, a signal converter is provided that comprises a plurality of current control devices respectively coupled at a first terminal thereof to a common voltage source and respectively coupled at a second terminal thereof to a common current source. Each of the current control devices has a portion of electrical current from the current source flowing through it that is proportional to a voltage applied to respective control terminals thereof. A plurality of switching devices selectably couples the control terminal of each current control device to either an upper reference voltage or a lower reference voltage responsive to a value of a binary digit of a digital word respectively provided to a control terminal of each of the switching devices. An output node is commonly connected to the second terminals of the plurality of current control devices and provides a voltage between the upper and lower reference voltages proportional to a number of the current control devices coupled to each reference voltage.

In yet another aspect of the invention, a digital-to-analog converter (DAC) includes a voltage reference circuit providing an upper reference voltage and a lower reference voltage, where the potential difference between the upper reference voltage and a reference potential is selected responsive to a reference voltage selection digital word. The potential difference between the upper and lower reference voltages is constant for any reference voltage selection digital word. The DAC includes a voltage interpolator having a plurality of transistors commonly connected to a supply voltage at first terminals thereof and commonly connected to a current source at second terminals thereof, a plurality of switching devices selectably coupling a control terminal of each of the transistors to one of the upper and lower reference voltages in accordance with a value of a binary digit of an interpolation point selection digital word, and an output node coupled to the commonly connected second terminals and providing a voltage between the upper and lower reference voltages proportional to a number of the transistors coupled to each reference voltage.

DETAILED DESCRIPTION OF PREFERRED EMBODIMENTS

Figure 1:
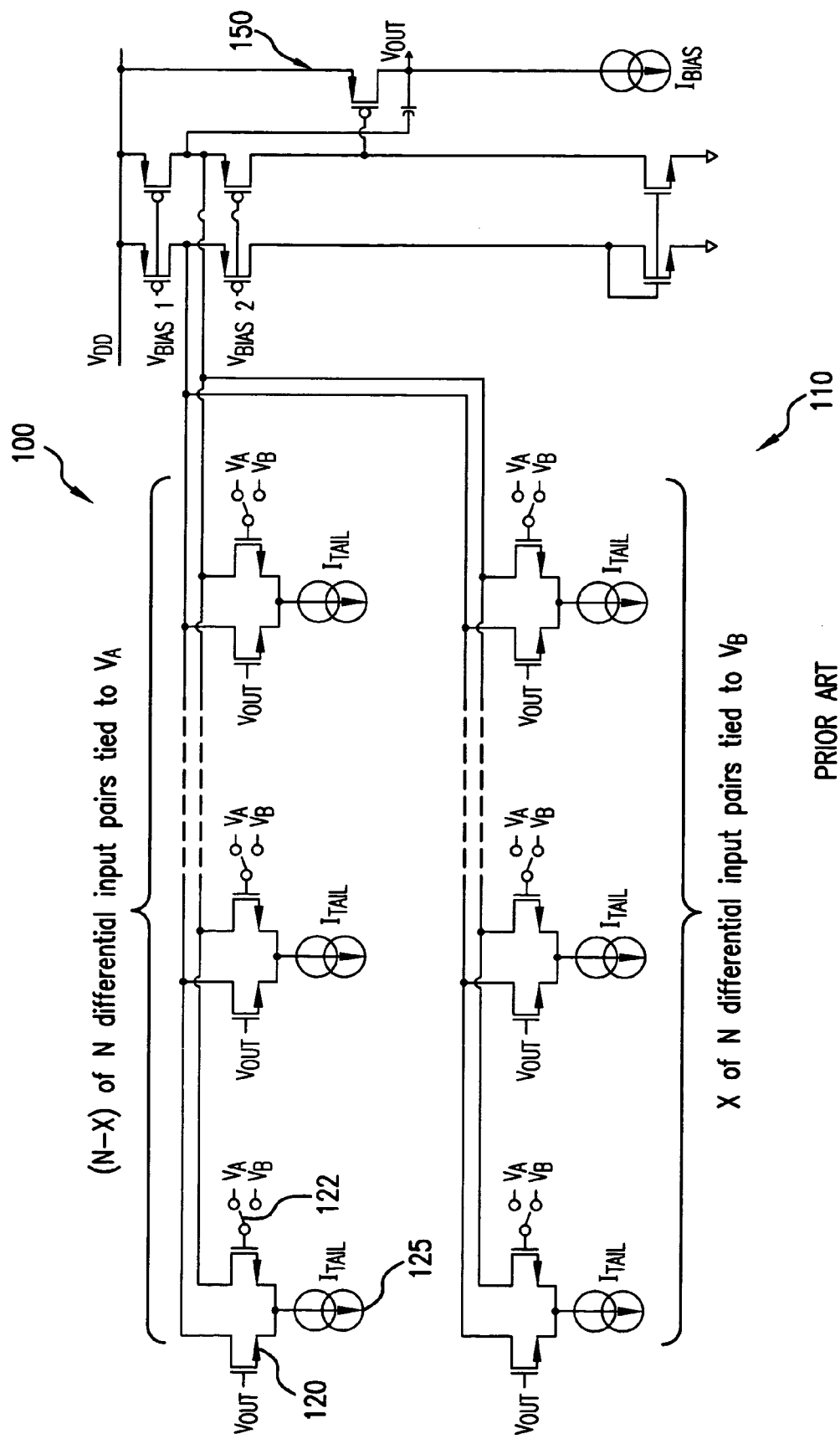
FIG. 1 is a schematic diagram of a voltage interpolator of the prior art.
Figure 2:
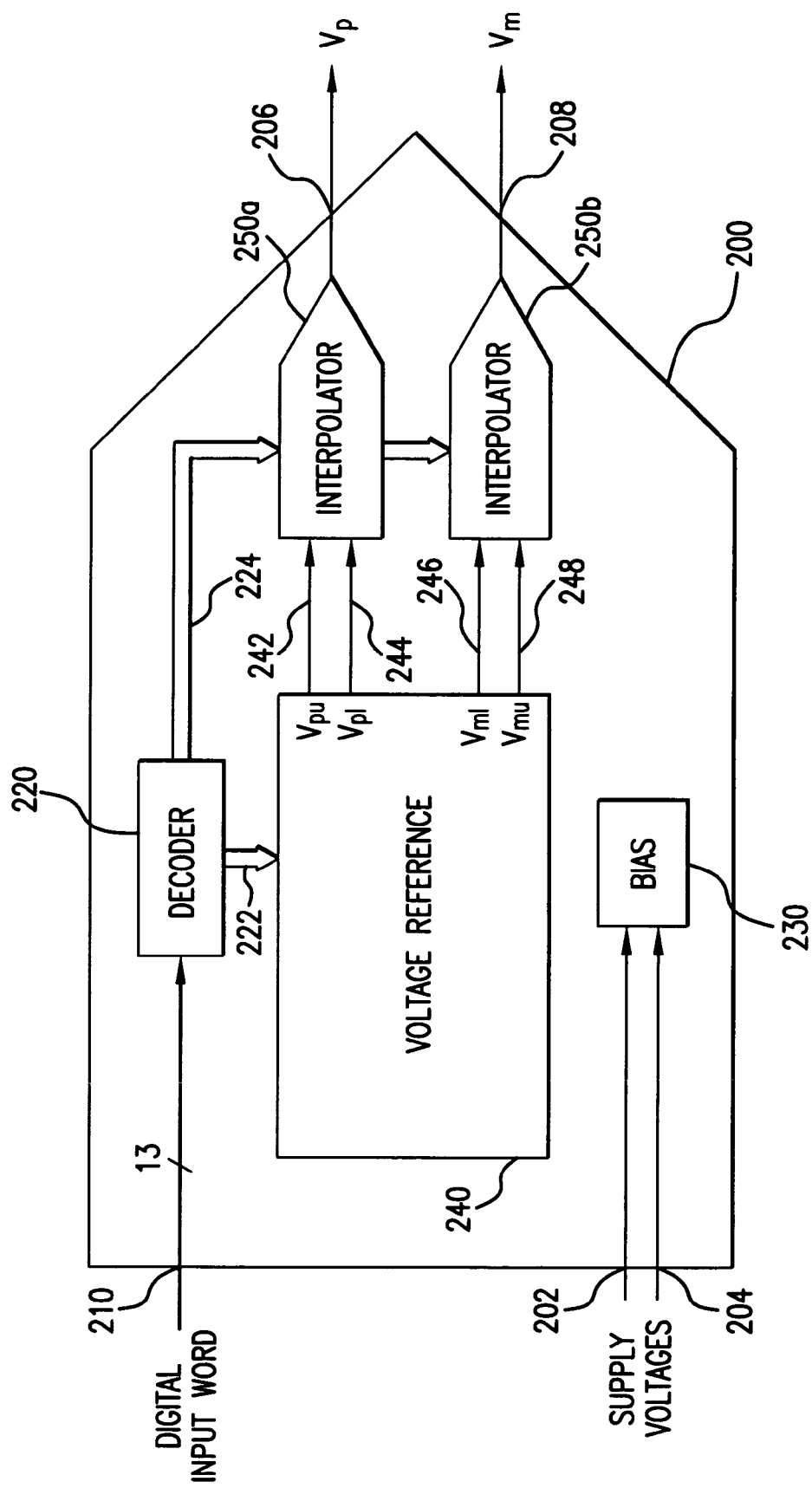
FIG. 2 is a schematic block diagram of a differential digital-to-analog converter consistent with the present invention.

Referring to FIG. 2, there is shown a schematic block diagram of a differential DAC 200 implementing aspects of the present invention. It is to be understood that the exemplary embodiment of FIG. 2 is used to illustrate various aspects of the present invention and is not intended to limit the invention to any particular implementation. Indeed, the exemplary DAC 200 is a differential DAC and, as such, has beneficial features outside the scope of the present invention. However, the invention is easily applicable to other implementations, such as single-ended DACs, as will be apparent upon contemplation of the disclosure that follows.

DAC 200 may be formed of its constituent components on a suitable circuit die. The DAC 200 receives at its power supply terminals 202, 204 a number of supply voltages from which operating power is derived. It is to be understood that while only two supply lines are shown, a greater number of supply lines are possible and such configurations are intended to fall within the scope of the present invention. The supply voltages are provided to a suitable biasing network 230 for providing the proper biasing voltages and currents.

As is shown in FIG. 2, a digital code word indicative of a desired analog output voltage is provided to the DAC 200 via suitable data lines, such as illustrated at 210. The data word is decoded by a decoder 220 to form a digital word to relay to voltage reference circuit 240 over signal lines 222 and a digital word to relay to voltage interpolators 250a, 250b over signal lines 224. The voltage reference circuit 240 provides reference voltages to voltage interpolators 250a, 250b on signal lines 242, 244, 246, 248. The voltage interpolators 250a, 250b then produce a voltage at their respective outputs in accordance with the digital word on line 210 by processes described below.

In the exemplary embodiment of FIG. 2, voltage reference circuit 240 produces two sets of reference voltages $V_{pu}$, $V_{pl}$, $V_{ml}$, and $V_{mu}$, on signal lines 242, 244, 246 and 248, respectively. The difference in potential between the reference voltage in each set, e.g., $(V_{pu}-V_{pl})$ is set to be constant and small, such as less than 10 mV. The difference in potential between any of the reference voltages and a reference potential such as ground potential or, similarly, the difference in potential between corresponding reference voltages in both sets, e.g., $(V_{pu}-V_{mu})$, varies in accordance with the digital input word provided to digital input lines 210. In this manner, voltage interpolators 250a, 250b may each be provided with the same digital code word to produce the interpolated output voltage.

Figure 3:
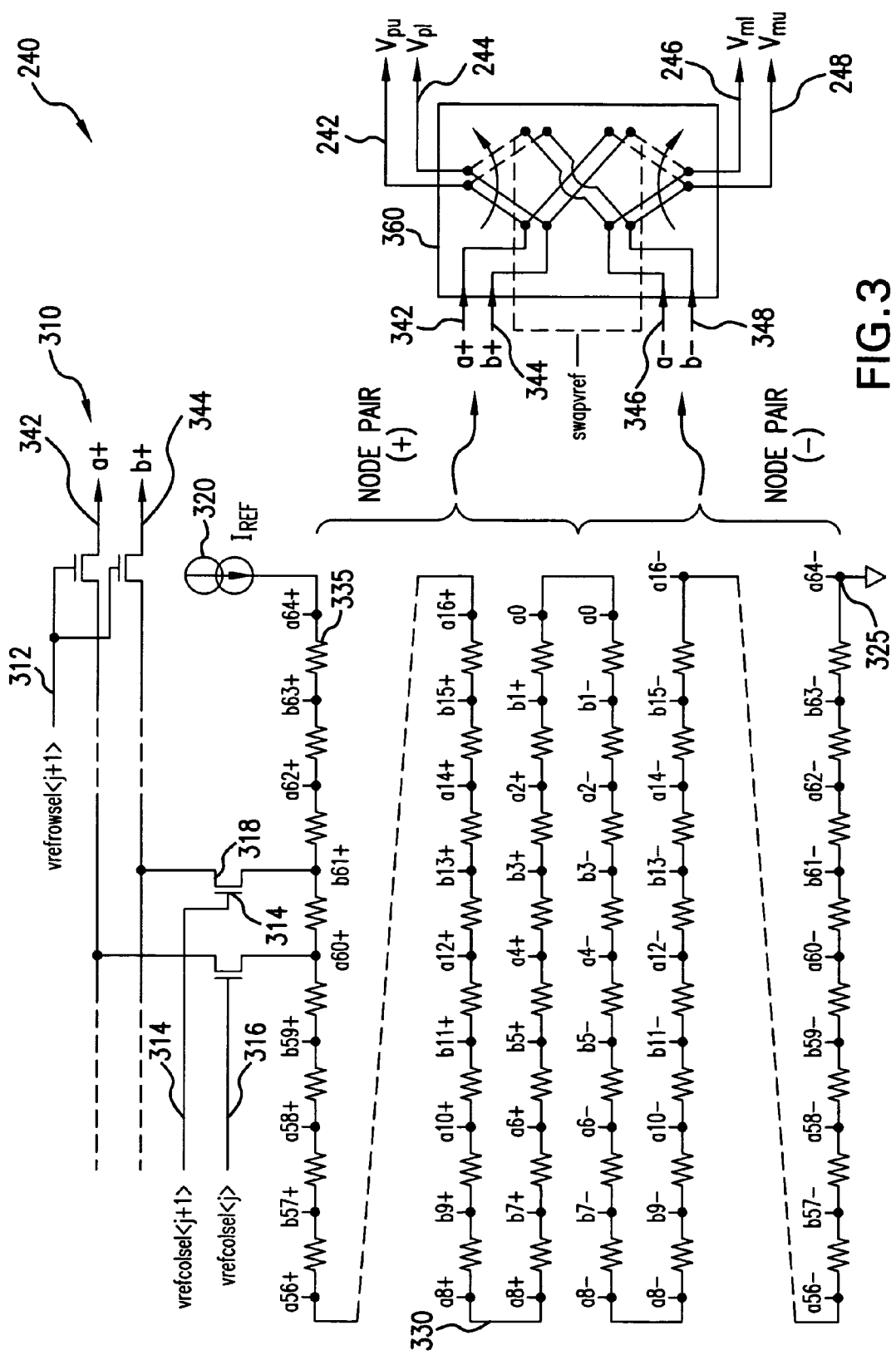
FIG. 3 is a schematic diagram of an exemplary voltage reference circuit consistent with the present invention.

An exemplary voltage reference circuit 240 operably consistent with the present invention is illustrated in FIG. 3. The voltage reference circuit 240 includes a plurality of resistors, a representative one of which is shown at 335, electrically connected in series one with another to form a resistor string 330. The resistor string is supplied with a reference current $I_{REF}$ from a current source 320 and is terminated by a node 325 at a reference potential, such as ground. The resistors 335 and the reference current are selected to provide a predetermined voltage drop across the resistor that is the potential difference in reference voltages supplied to the voltage interpolators 250a, 250b. For example, if the potential difference between reference voltages is to be 8 mV, the resistors 335 may be constructed to be 500 ohms and the current source 320 may be constructed to provide 16 µA.

The resistor string 330 is tapped at every node between resistors 335 by a tap selection network 310. Each node is tapped through a switching device, a representative one of which is shown at 318, which is activated into a conducting state or a non-conducting state in accordance with the value of a binary digit on tap selection lines, such as those representatively illustrated at 314 and 316, coupled to control terminals 315 and 317, respectively. The switching devices may be implemented through a suitable transistor or other device that can be operated into a conducting state or a non-conducting state. The tap selection network 310 may be constructed so as to select a pair of nodes that encompass a single resistor 335 responsive to a properly formatted digital word being provided to the tap selection lines 314, 316 and to provide thereby the reference voltages at output terminals 342.

In the exemplary differential DAC presently described, the voltage reference circuit 240 provides two sets of reference voltages, one set to each voltage interpolator 250a, 250b. As indicated in FIG. 3, the tap selection network 310 may be constructed to simultaneously select a set of reference voltages from the upper half of the resistor string 330 and a set of reference voltages from the lower half of the resistor string 330. For example, the tap selection network 310 may be constructed to select reference voltages tapped from a pair of resistors 335 equidistant from a central node 337 in the resistor string 330. The reference voltages corresponding to the potential difference across each resistor is provided to the voltage interpolators 250a, 250b.

In certain applications, it may be desirable to swap the set of reference voltages provided to each voltage interpolator 250a, 250b. To that end, a swapping device 360 may be electrically interposed between the tapped resistor string 330 and the voltage interpolators 250a, 250b. Such a swapping circuit beneficially decreases the overall number of switching devices and associated control signals in the voltage reference circuit 240. As is shown in FIG. 3, the selected node lines 342, 344 are coupled to a first pair of input nodes to swapping device 360 and selected node lines on the opposing side of the central node 337 (not shown) are coupled at 346, 348 to a second pair of input nodes to swapping device 360. The pairs of reference voltages are provided on the output terminal pairs 242, 244 and 246, 248. Upon activation of a swapping signal swapvref, the pairs of input terminals coupled to respective pairs of output terminals are swapped through a suitable switching mechanism. It is to be understood that while the switching mechanism of swapping device 360 is illustrated as a double-pole double-throw switch, limitation to a mechanical switch is neither implied nor preferable. The switching mechanism is illustrated through traditional switch schematic symbols for purposes of description, but will generally be implemented through a suitable arrangement of transistors.

Figure 4:
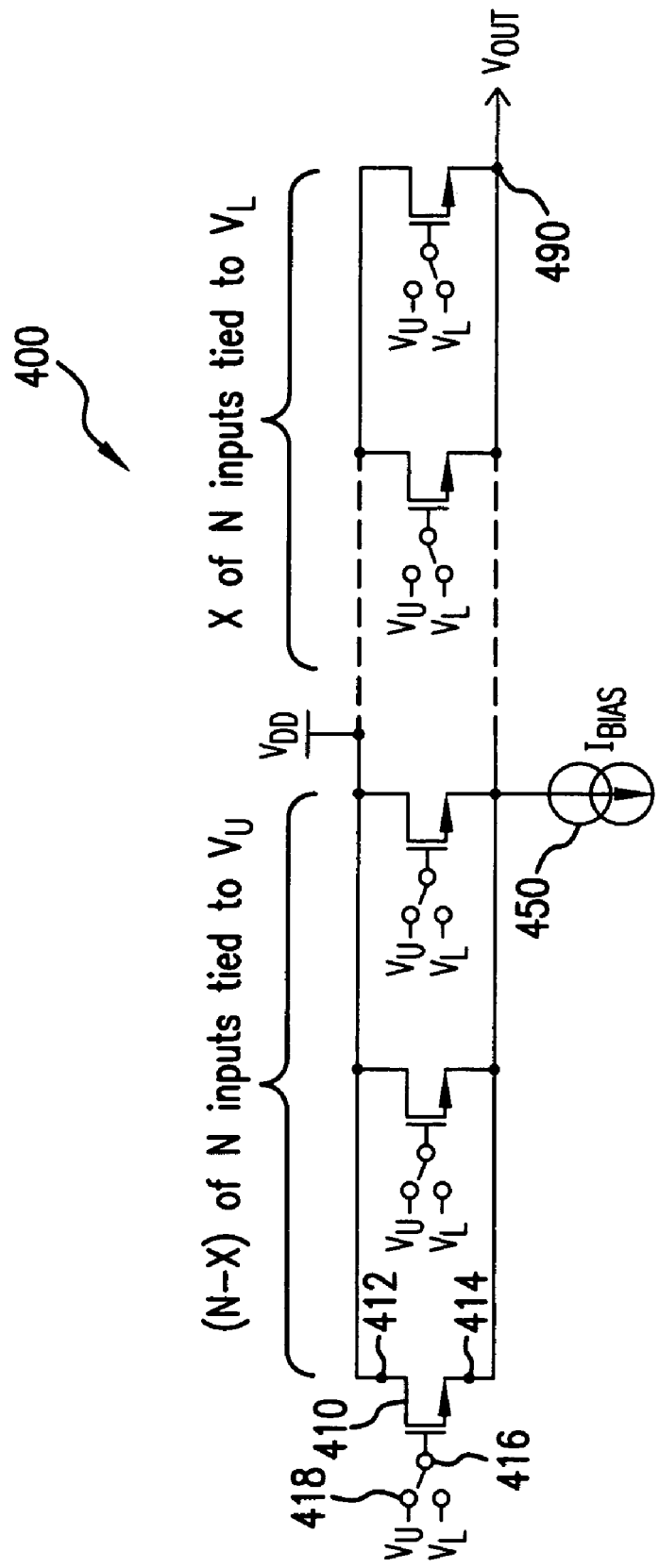
FIG. 4 is a schematic diagram of an exemplary embodiment of a voltage interpolator of the present invention.

Referring now to FIG. 4, there is shown an exemplary embodiment of a voltage interpolator 400 implementing certain aspects of the present invention. The voltage interpolator 400 includes a plurality of current control devices, a representative one of which is illustrated at 410, which may be the N-type metal-oxide-semiconductor (NMOS) transistors shown, or may be any device or configuration of devices, such as a P-type metal-oxide-semiconductor (PMOS) transistor or bipolar junction transistors (BJT), that controls the flow of current through its terminals 412, 414 in accordance with a voltage applied to its control terminal 416, to produce thereby a corresponding voltage drop, or potential difference, between those terminals 412, 414. The current control devices 410 will be referred to hereinafter as transistors 410, but it is to be understood that any suitable current control device may be substituted therefor.

As is shown in FIG. 4, the transistors 410 are commonly interconnected at first terminals 412, to which a constant supply voltage $V_{DD}$ is provided, and are interconnected to have common second terminals 414 coupled to a constant current source 450. An output node 490 is coupled to the commonly connected second terminals 414 and the constant current source 450 to form a multiple-input, NMOS source follower having approximately unity gain.

Each transistor 410 is coupled to one of an upper reference voltage $V_U$ and a lower reference voltage $V_L$ at its control terminal 416. These reference voltages may be provided by a voltage reference circuit, such as that illustrated in FIG. 3, where either $V_{mu}$ or $V_{pu}$ of FIG. 3 is represented by $V_U$ in FIG. 4 and $V_{pl}$ or $V_{ml}$ is represented by $V_L$. In accordance with the present invention, the output voltage $V_{OUT}$ is a voltage interpolated between the upper and lower reference voltages in proportion with the number of transistors 410 that are coupled to each reference voltage following the relationship:

$$V_{OUT} = (V_L - \overline{V}_{GS}) + (V_U - V_L) \times \frac{X}{N},$$

where X is the number of NMOS gates coupled to $V_L$, N is the total number in the plurality of transistors forming the interpolator and $\overline{V}_{GS}$ is a nominal value of the gate/source voltage drop across transistors 410. The linear relationship stated mathematically above is valid when the potential difference between reference voltages, i.e., ($V_U$-$V_L$) is small and all transistors remain biased. For example, such condition can be achieved when $|V_U - V_L| \times g_m$ is less than $I_{BIAS}/2$, where $g_m$ is the NMOS transconductance. It is to be noted that in differential DAC implementations, the effects of the $\overline{V}_{GS}$ offset are ameliorated in that the offset appears on both outputs 206, 208 and is not felt in the difference between the two outputs 206, 208.

Figure 5:
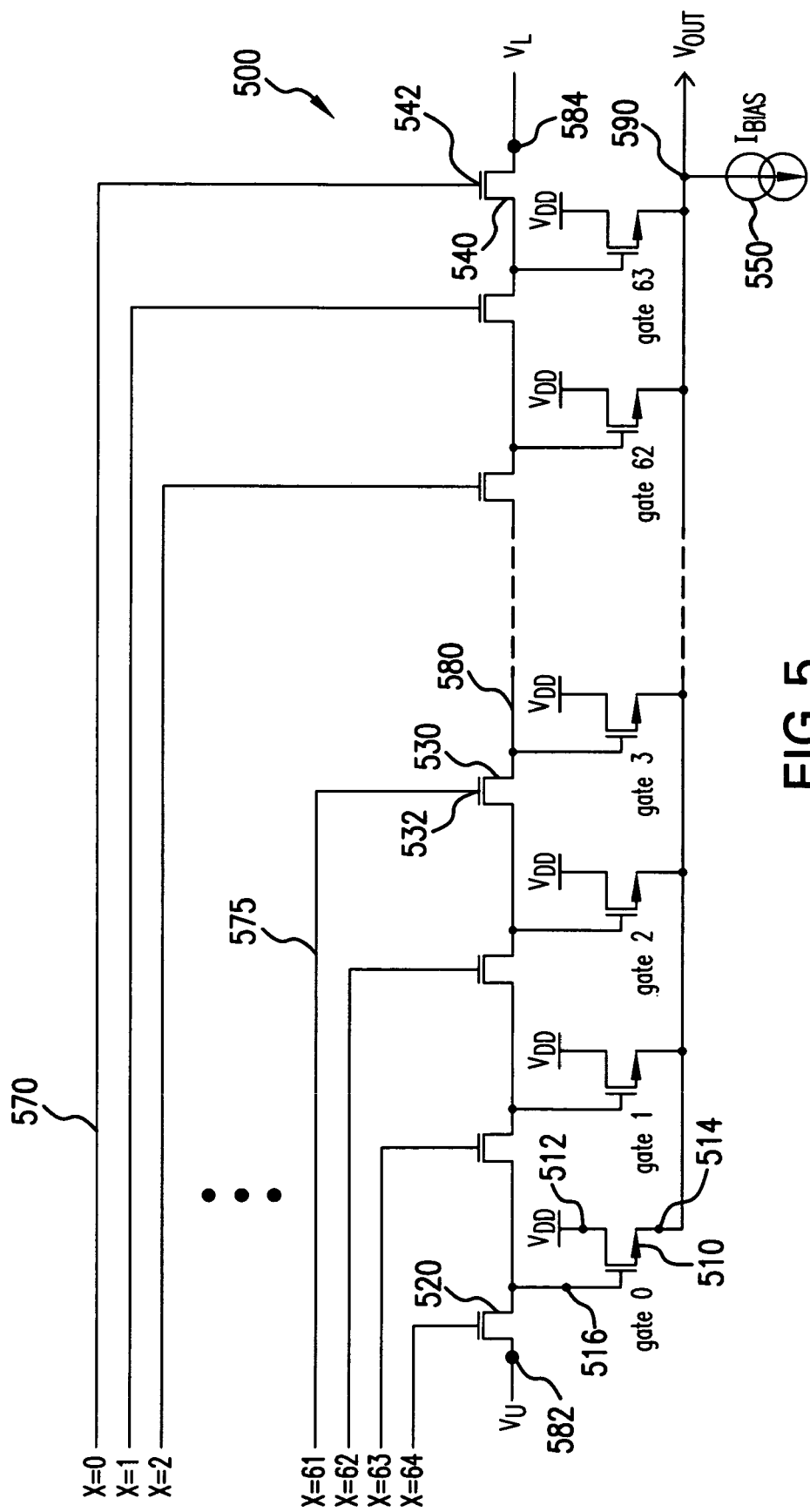
FIG. 5 is a schematic diagram of an exemplary embodiment of a voltage interpolator of the present invention using a switching device chain arrangement for selecting the interpolation point.

Particularly beneficial embodiments of the invention implement configurations that recover space otherwise consumed by switching devices. Such an embodiment is illustrated in FIG. 5. The exemplary voltage interpolator 500 includes a plurality of current control devices, such as NMOS transistors, a representative one of which is shown at 510. Each NMOS transistor 510 is commonly connected to a constant voltage $V_{DD}$ at its drain terminal 512 and is commonly connected to a current source 550 at its source terminal 514, to form a multiple-input NMOS source follower amplifier. The gate 516 of each NMOS transistor 510 is connected between pairs of series-connected switching devices, representatively illustrated at 520, 530 and 540, forming a switching device chain 580. A switching device 520 at one end of the switching device chain 580 is connected at its terminal 582 to upper reference voltage $V_U$ and a switching device 540 at the opposite end of the switching device chain 580 is connected at its terminal 584 to lower reference voltage $V_L$. The activation of a single switching device, such as that illustrated at 530, into its non-conducting state selects the interpolation point by causing N-X gates to be coupled to $V_U$ and the remaining X gates to be coupled to $V_L$. The switching devices may be activated into a conducting state or a non-conducting state in accordance with a value of a binary digit provided on control lines, such as those illustrated at 570 and 575, coupled to control terminals thereof, as shown at 532 and 542, respectively. For example, if N=64, and switching device 530 has been activated into its non-conducting state through a binary zero (0) on its control line 575, gates 0-2 will be connected to $V_U$ and gates 3-63 will be connected to $V_L$. The output voltage $V_{OUT}$ at output node 590 would be equal to ($V_L$-$\overline{V}_{GS}$)+($V_U$-$V_L$)×(61/64).

Figure 6:
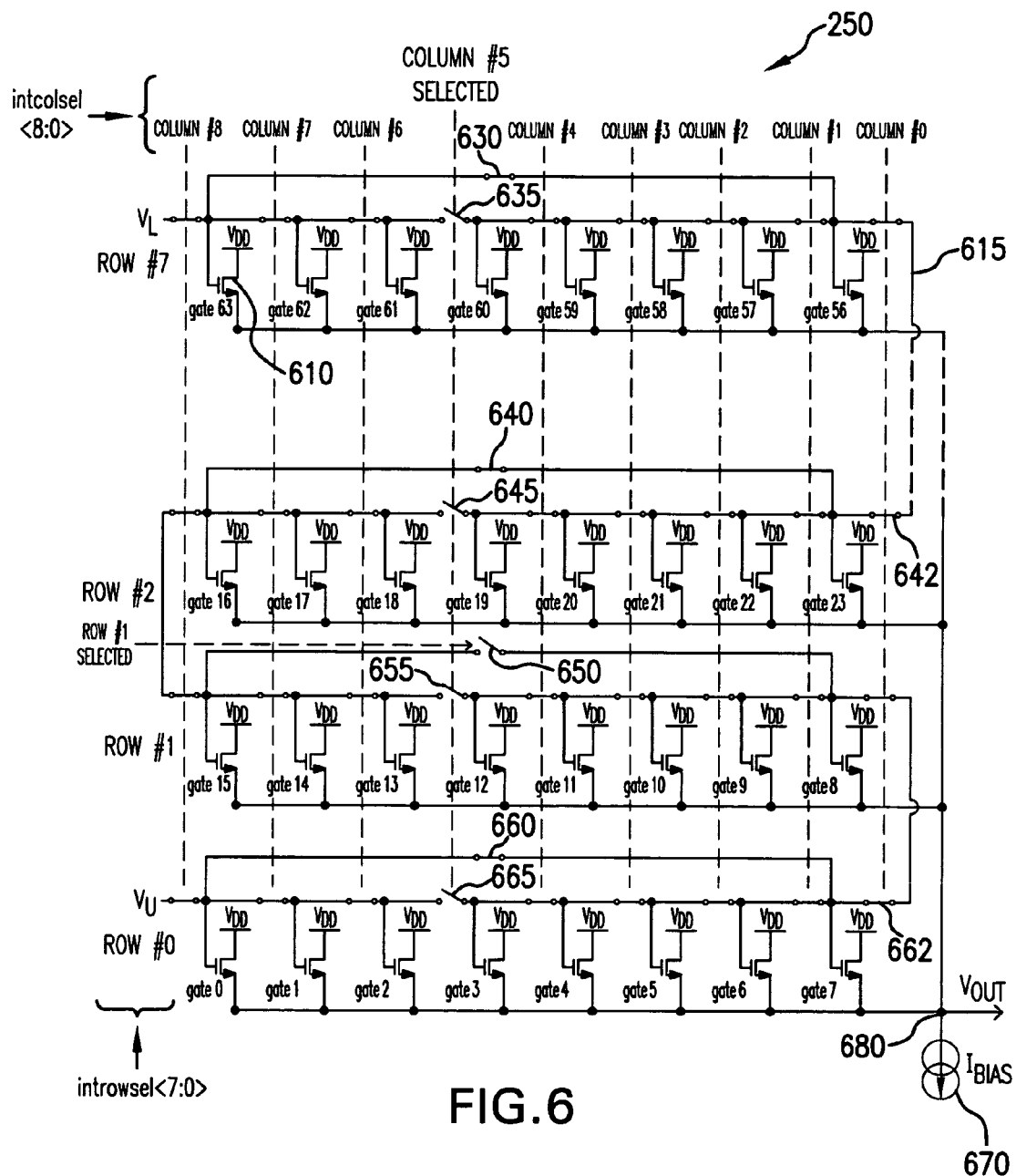
FIG. 6 is a schematic diagram of an exemplary embodiment of a voltage interpolator of the present invention using a row/column interpolation point selection mechanism.

Referring now to FIG. 6, there is shown an embodiment of a voltage interpolator 250 consistent with the present invention, which further reduces the spatial requirements for implementing the circuit. The voltage interpolator 250 includes a plurality of current control devices, such as represented by NMOS transistor 610, each of which are commonly coupled at drain terminals to the voltage supply rail $V_{DD}$ and commonly connected at source terminals to the biasing current source 670 and output node 680 to form a multiple-input NMOS source follower amplifier. However, in the exemplary embodiment illustrated in the Figure, the control of the switching is implemented through row/column selection. To that end, the switch device chain 615 is effectively folded so as to align those switching elements that are to be controlled by a respective column control line, which are not illustrated as mechanisms in FIG. 6, but are represented by the dashed lines labeled for each column. The column selection switches representatively illustrated at 635, 642, 645, 655, 663 and 665 are arranged to be mutually operated by a single column select line.

Such folding described above also structures the switch device chain 615 into rows that can be selected by a corresponding row selection line. As is shown in FIG. 6, row selection switches, such as shown at 630, 640, 650 and 660, are inserted into the voltage interpolator 250 to define a row in which the reference potentials $V_L$ and $V_U$ are separated. The row selection switches 630, 640, 650 and 660 are coupled to the switching device chain 615 so as to provide a short circuit path around all of the transistors in the corresponding row when the row selection switch 630, 640, 650 or 660 is activated into its conducting state.

It is to be understood that the folded switching device chain 615 described above need not result in a rectangular array, but may be constructed so that multiple switching devices may be controlled by a single control line. However, greater spatial savings are generally obtained when the transistors and switching devices are arranged on the circuit die in a rectangular array, such as that illustrated in FIG. 6. Greater spatial efficiency is achieved when the circuit is confined to a nearly square area.

In the example shown in FIG. 6, switching devices 635, 645, 655 and 665 corresponding to column 5 are activated into their non-conducting state and switching device 650 corresponding to row 1 is activated into its non-conducting state. When so configured, gates 0-12 are connected to $V_U$ and gates 13-63 are connected to $V_L$ resulting in an interpolated output voltage $V_{OUT}$ to be $(V_L-V_{GS})+(V_U-V_L)\times(51/64)$.

Among the beneficial features illustrated by the embodiment of FIG. 6 is the reduced number of control lines required to select an interpolation point. The reduced number of control lines also reduces the number of conductor traces that must be routed, which further adds to the space savings and resulting thereby in a reduction of manufacturing costs. The total number of control lines is determined by the number of rows and columns desired. For example, the exemplary embodiment of FIG. 6 requires only 17 control lines, instead of the 65 control lines required by the embodiment of FIG. 5.

In certain embodiments of the invention, a redundant switching device is added in every row so as to make all rows identical. Other embodiments may eliminate the redundant switches to achieve slight space savings. For example, switches 642 and 662 in FIG. 6 may be removed without altering the function of the circuit.

Figure 7:
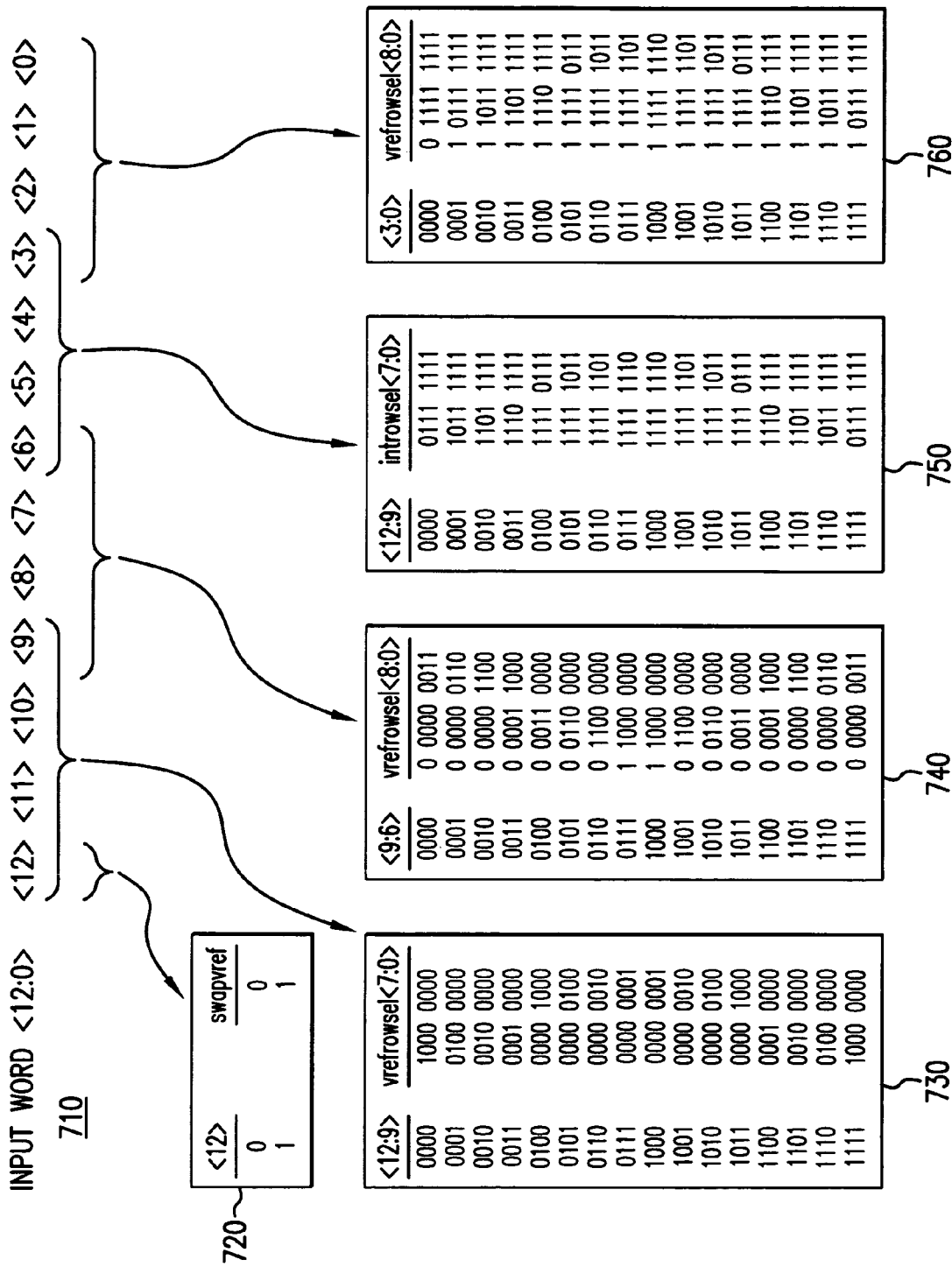
FIG. 7 is a diagram illustrating an exemplary digital word decoding scheme consistent with the present invention.

The present invention affords row/column selection of the output voltage point for both the voltage reference circuit 240 and the voltage interpolator circuit 250. An exemplary decoding scheme for the exemplary differential DAC 200 is illustrated in FIG. 7 and the signal lines corresponding to the tables depicted in the Figure are shown in FIGS. 2, 3 and 6. As is shown in FIG. 7, 13-bit digital input word 710, which is to be placed on signal lines 210 of DAC 200, is decoded into a voltage reference circuit swap bit, as shown at 720, an 8-bit voltage reference circuit row select word vrefrowsel, as shown at 730, a 9-bit voltage reference circuit column select word vrefcolsel, as shown at 740, an 8-bit voltage interpolator row select word introwsel, as shown at 750 and a 9-bit voltage interpolator column select word intcolsel, as shown at 760. In the decoding scheme of FIG. 7, a digit of a word having a value of one (1) activates the corresponding switching device into its conducting state and a digit of a word having a value of zero (0) activates a corresponding switching device into its non-conducting state.

A DAC, by definition, produces an output voltage in accordance with a digital word provided thereto, where the output voltage cannot exceed reference voltages provided thereto. The reference voltages are typically derived from the rail voltages used to supply power to the DAC. It is to be noted that the voltage interpolator of the present invention fulfills this definition of a DAC, i.e, it produces an output voltage between reference voltages in accordance with a digital word selecting the interpolation point.

Figure 8:
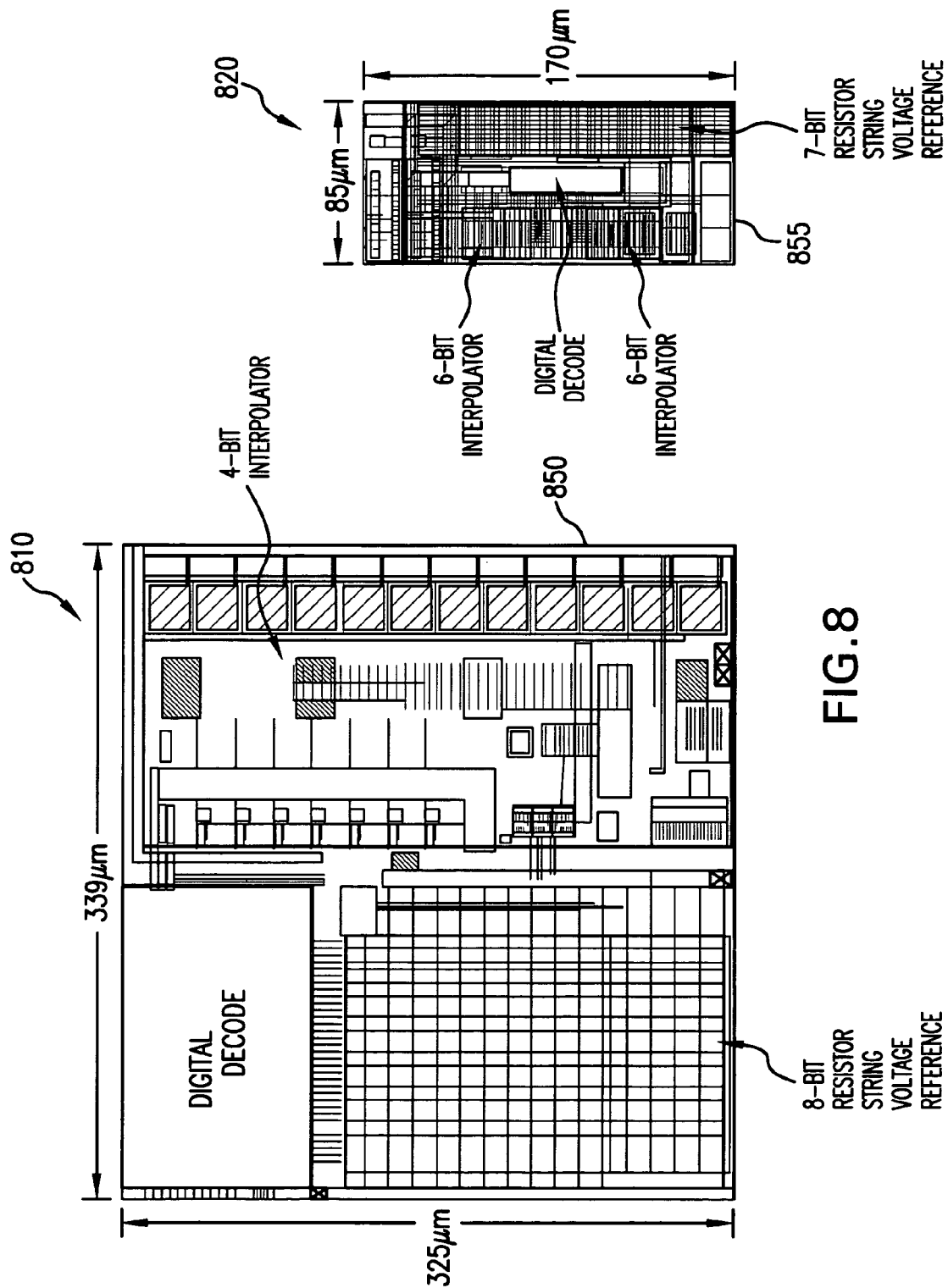
FIG. 8 is a diagram illustrating the spatial efficiency of the present invention.

The reduction in spatial occupancy afforded by the present invention over the prior art is illustrated in FIG. 8. A 12-bit single ended DAC circuit using a 4-bit interpolator of the prior art manufactured through a 0.18 μm CMOS process on a circuit die 850 is illustrated at 810. A 13-bit differential DAC using two 6-bit interpolators of the present invention and manufactured through a 0.13 μm CMOS process on a circuit die 855 is illustrated at 820. Although the two circuits are manufactured through different processes, the size difference between interpolators is apparent from the area consumed by the interpolator relative to that of the respective voltage reference circuit in each of the two circuits. It is to be noted that one of the 6-bit interpolators of DAC 620 requires a mere 1.6% of the area required by the prior art 4-bit interpolator of DAC 610. To minimize the total area of the DAC circuit, the voltage reference and the total voltage interpolation circuitry should be of comparable size, i.e., each should occupy substantially the same amount of area on the circuit die.

In addition to the space savings, the present invention does not implement feedback and avoids the design concerns associated therewith. Additionally, the voltage interpolator of the present invention requires less power than prior art voltage interpolators. For example, in the prior art 12-bit DAC shown at 810 in FIG. 8, Idd=223 μA typically, while the 13-bit differential DAC 820 using the interpolation of the present invention requires Idd=31 μA typically. The power requirements of the present invention are determined by the speed at which the output is to be switched. The circuitry needed to implement the invention is minimal, requiring no output amplifiers and other support circuitry required by prior art designs.

The descriptions above are intended to illustrate possible implementations of the present invention and are not restrictive. Many variations, modifications and alternatives will become apparent to the skilled artisan upon review of this disclosure. For example, components equivalent to those shown and described may be substituted therefor, elements and methods individually described may be combined and elements described as discrete may be distributed across many components. The scope of the invention should therefor be determined not with reference to the description above, but with reference to the appended Claims, along with their full range of equivalents.

What is claimed is:

1. An electrical circuit comprising:
a plurality of current control devices commonly interconnected at first terminals thereof and commonly interconnected at second terminals thereof, each of said current control devices having an amount of electrical current flowing therethrough proportional to a voltage applied to respective control terminals thereof;
a plurality of switching devices selectably coupling said respective control terminal of each of said current control devices to one of an upper reference voltage and a lower reference voltage, said switching devices are connected electrically in series one with another to form a switching device chain, said first reference voltage and said second reference voltage being respectively applied to first and second terminal ends of said switching device chain, said control terminal of each of said current control devices being electrically coupled to said switching device chain between a respective pair of said switching devices thereof, said switching devices in said switching device chain are arranged into a set of rows and a set of columns such that all of said switching devices respectively in each of said columns are mutually activated into one of a conducting state and a non-conducting state by a signal on a common control line;
a row selection switching device electrically coupled to said switching device chain at each of said sets of rows thereof so as to provide a short circuit path around all of said switching devices respectively in each of said sets of rows when said corresponding row selection switching device is activated into a conducting state; and
an output node coupled to said commonly interconnected second terminals and to a constant current source and providing thereby a voltage between said upper reference voltage and said lower reference voltage proportional to a number of said current control devices coupled to each of said upper reference voltage and said lower reference voltage.

2. The electrical circuit as recited in claim 1, wherein said current control devices are selected from the group consisting of N-type metal-oxide-semiconductor transistors, P-type metal-oxide-semiconductor transistors and bipolar junction transistors.

3. A signal converter comprising:
a plurality of current control devices respectively coupled at a first terminal thereof to a common voltage source and respectively coupled at a second terminal thereof to a common current source, each of said current control devices having a portion of electrical current from said current source flowing therethrough proportional to a voltage applied to respective control terminals thereof;
a plurality of switching devices selectably coupling said control terminal of each of said current control devices to one of an upper reference voltage and a lower reference voltage responsive to a value of a binary digit of a digital word respectively provided to a control terminal of each of said switching devices, said switching devices are connected electrically in series one with another to form a switching device chain, said first reference voltage and said second reference voltage being respectively applied to first and second terminal ends of said switching device chain, said control terminal of each of said current control devices being electrically coupled to said switching device chain between a respective pair of said switching devices thereof, said switching devices in said switching device chain are arranged into a set of rows and a set of columns such that all of said switching devices respectively in each of said columns are mutually activated into one of a conducting state and a non-conducting state by a signal on a common control line;
a row selection switching device electrically coupled to said switching device chain at each or said rows thereof so as to provide a short circuit path around all of said switching devices respectively in each of said rows when said corresponding row selection switching device is activated into a conducting state; and
an output node commonly connected to said second terminal of said plurality of current control devices and providing thereby a voltage between said upper reference voltage and said lower reference voltage proportional to a number of said current control devices coupled to each of said upper reference voltage and said lower reference voltage.

4. The signal converter as recited in claim 3, wherein said control terminal of a set of said switching devices are commonly connected so as to be mutually responsive to said value of said binary digit.

5. The signal converter as recited in claim 3 further including a voltage reference circuit coupled to said switching device chain and providing at said terminal ends thereof said upper reference voltage and said lower reference voltage, wherein a potential difference between said upper reference voltage and a reference potential is selected responsive to a reference voltage selection digital word.

6. The signal converter as recited in claim 5 further including a decoder receiving at an input thereof a digital word defining said voltage at said output node and providing at respective outputs thereof said digital word and said reference voltage selection digital word.

7. A digital-to-analog converter comprising:
a voltage reference circuit providing an upper reference voltage and a lower reference voltage, wherein a potential difference between said upper reference voltage and a reference potential is selected responsive to a reference voltage selection digital word and a potential difference between said upper reference voltage and said lower reference voltage is constant for any said reference voltage selection digital word; and
a voltage interpolator including:
a plurality of transistors commonly connected to a supply voltage at first terminals thereof and commonly connected to a current source at second terminals thereof;
a plurality of switching devices selectably coupling a control terminal of each of said transistors to one of said upper reference voltage and said lower reference voltage in accordance with a value of a binary digit of an interpolation point selection digital word, said switching devices are connected electrically in series one with another to form a switching device chain, said voltage reference circuit coupled to said switching device chain and providing at respective terminal ends thereof said first reference voltage and said second reference voltage, said control terminal of each of said transistors being electrically coupled to said switching device chain between a respective pair of said switching devices thereof, said switching devices in said switching device chain are arranged into a set of rows and a set of columns such that all of said switching devices respectively in each of said columns are mutually activated into one of a conducting state and a non-conducting state by a signal on a common control line;
a row selection switching device electrically coupled to said switching device chain at each of said rows thereof so as to provide a short circuit path around all of said switching devices respectively in each of said rows when said corresponding row selection switching device is activated into a conducting state; and
an output node coupled to said commonly connected second terminals and providing a voltage between said upper reference voltage and said lower reference voltage proportional to a number of said transistors coupled to each of said upper reference voltage and said lower reference voltage.

8. The digital-to-analog converter as recited in claim 7 further including a decoder receiving at an input thereof a digital word defining said voltage at said output node and providing at respective outputs thereof said interpolation point selection digital word and said reference voltage selection digital word.

9. The digital-to-analog converter as recited in claim 7, wherein said voltage reference circuit and said voltage interpolator are constructed on a circuit die, said voltage interpolator occupying an area on said circuit die that is substantially equal to an area on said circuit die occupied by said voltage reference circuit.

10. The digital-to-analog converter as recited in claim 7 further including a second said voltage interpolator, wherein said voltage reference circuit provides a unique set of said upper reference voltage and said lower reference voltage to each of said voltage interpolators, said reference potential being one of said upper reference voltage and said lower reference voltage provided to said second voltage interpolator.

11. The digital-to-analog converter as recited in claim 10, wherein said voltage interpolator and said second voltage interpolator mutually receive at respective inputs thereof said interpolation point selection word.

* * * * *